(12) United States Patent
Sudan et al.

(10) Patent No.: US 9,923,395 B2
(45) Date of Patent: Mar. 20, 2018

(54) METHOD FOR CHARGING A NIMH BATTERY, A BATTERY CHARGER AND A SYSTEM COMPRISING A BATTERY CHARGER AND A HEARING DEVICE

(71) Applicant: Sonova AG, Stafa (CH)

(72) Inventors: Jung Sudan, Gundisau (CH); Daniel Probst, Uerikon (CH); Kathrin Vuille-Dit-Bille, Zurich (CH)

( * ) Notice: Subject to any disclaimer, the term of this patent is extended or adjusted under 35 U.S.C. 154(b) by 192 days.

(21) Appl. No.: 14/428,790

(22) PCT Filed: Sep. 18, 2012

(86) PCT No.: PCT/EP2012/068331
§ 371 (c)(1),
(2) Date: Mar. 17, 2015

(87) PCT Pub. No.: WO2014/044292
PCT Pub. Date: Mar. 27, 2014

(65) Prior Publication Data
US 2015/0229151 A1    Aug. 13, 2015

(51) Int. Cl.
*H02J 7/00*        (2006.01)
*G01R 31/36*       (2006.01)
*H04R 1/10*        (2006.01)

(52) U.S. Cl.
CPC ........ *H02J 7/0052* (2013.01); *G01R 31/3624* (2013.01); *G01R 31/3675* (2013.01); *H02J 7/0072* (2013.01); *H04R 1/1025* (2013.01); *H04R 2225/31* (2013.01)

(58) Field of Classification Search
CPC ...... H01M 10/446; H01M 10/44; H02J 7/007; H02J 7/008; H02J 7/0068; H02J 7/022; H02J 7/0073; Y02E 60/12
USPC ......................................................... 320/137
See application file for complete search history.

(56) References Cited

U.S. PATENT DOCUMENTS

| | | | |
|---|---|---|---|
| 5,686,815 A | 11/1997 | Reipur | |
| 2001/0001533 A1* | 5/2001 | Stuck Andersen ... | H01M 10/44 320/150 |
| 2002/0149357 A1* | 10/2002 | Morimoto .......... | G01R 31/3648 324/150 |
| 2004/0164711 A1* | 8/2004 | Hayashi ................. | H02J 7/042 320/134 |
| 2005/0088140 A1 | 4/2005 | Bushong | |
| 2008/0122400 A1* | 5/2008 | Kubota ................. | H02J 7/0004 320/106 |
| 2010/0015530 A1* | 1/2010 | Katayama ................ | H01G 9/02 429/246 |
| 2011/0248673 A1* | 10/2011 | Aerts ....................... | H02J 7/025 320/108 |
| 2011/0267009 A1 | 11/2011 | Nakatsuji | |
| 2012/0101754 A1 | 4/2012 | Halme | |

FOREIGN PATENT DOCUMENTS

EP      1 455 194 B1    2/2006

OTHER PUBLICATIONS

European Examination Report for 12 762 265.2-1804 dated Jun. 28, 2016.
International Search Report for PCT/EP2012/068331 dated May 15, 2013.
Written Opinion for PCT/EP2012/068331 dated May 15, 2013.

* cited by examiner

*Primary Examiner* — Arun Williams

(57) ABSTRACT

The present invention provides a method for charging a NiMH battery, comprising estimating a state of charge of the battery (100), determining an end of charging time based on the estimated state of charge (200), applying a constant charging current with a rate in the range from 0.9 C to 2.1 C to the battery until a threshold voltage is reached (300), upon reaching the threshold voltage, applying a constant charging voltage substantially equal to the threshold voltage to the battery (400) and continuing applying the constant charging voltage to the battery until the end of charging time is reached (500). Furthermore, a battery charger adapted to perform such a method as well as a system comprising such a battery charger and a hearing device powered by a NiMH battery are given.

17 Claims, 3 Drawing Sheets

METHOD FOR CHARGING A NIMH BATTERY, A BATTERY CHARGER AND A SYSTEM COMPRISING A BATTERY CHARGER AND A HEARING DEVICE

TECHNICAL FIELD

The present invention relates to charging of rechargeable batteries, in particular to a method of charging NiMH batteries. The present invention further pertains to a battery charger capable of performing the proposed method as well as to a system comprising such a battery charger and a hearing device powered by a NiMH battery.

BACKGROUND OF THE INVENTION

Portable electronic devices are increasingly being powered by rechargeable batteries. This is also the case for miniature hearing devices adapted to be worn at an ear or at least partially within an ear canal of a user. Such hearing devices include ear phones, communication devices, hearing aids (also referred to as hearing prostheses or hearing instruments) for hard of hearing people or hearing enhancement devices for augmenting the hearing capability of normal hearing persons, as well as hearing protection devices designed to prevent noise-induced hearing loss. Due to the small size of such hearing devices the batteries employed therein are tiny and therefore often difficult to handle, e.g. when replacing a depleted battery with a new one, especially for elderly users with reduced dexterity. Hence, the use of rechargeable batteries which do not need to be removed from a device for recharging represent a considerable improvement for such users. Furthermore, such hearing devices are typically utilised for prolonged periods of time, e.g. during most of the day on a daily basis, so the batteries need to be replaced very often, for instance every few days. This puts a substantial financial burden on the users of such devices due to the considerable cost of the batteries required for operating them.

Only recently have battery technologies evolved to the point where the capacity of a small rechargeable battery cell, such as a size 10A battery is sufficient to operate hearing devices continuously for a number of days. The limited space available and the prolonged runtime of hearing devices place formidable requirements on the type of rechargeable batteries applicable therein. Ideally for extended wear hearing devices, a suitable rechargeable battery should feature the capability to provide small currents, e.g. on the order of 40 µA, for 10 to 12 days, i.e. have a capacity of 10 to 12 mAh, and to be chargeable with high currents in order to minimise the time for recharging the battery. Presently, NiMH (Nickel-Metal Hydride) batteries are a good candidate for use in such hearing devices. For applications where the battery cannot be removed from the hearing device, long battery life in terms of a high number of recharging cycles is an important prerequisite. Factors which adversely impact battery life include deep discharge as well as excessive overcharging. Both can result in a permanent loss of capacity in a NiMH battery cell. Therefore, the employed charging algorithm has a considerable influence on battery life time. The goal is typically to minimise the time it takes to recharge the battery, whilst ensuring that maximum charge is stored in the battery, i.e. that the battery is filled to its maximum capacity, and at the same time maximising battery longevity by maintaining a high battery capacity over a large number of recharging cycles. Consequently, there is a need for efficient charging methods for small NiHM batteries utilised in hearing devices.

EP 2 259 404 A1 discloses a charging algorithm for NiMH batteries, which (re-)charges the battery in a relatively short time and in a relatively gentle manner with regards to the battery's life time degradation, and which may be used for listening devices such as hearing instruments. According to the teaching of EP 2 259 404 A1 the charging process is not deliberately terminated, e.g. after a specific charging time, and may continue after the battery has reached its full capacity. This bears the risk of overcharging which in turn can result in a reduced battery life.

SUMMARY OF THE INVENTION

The object of the present invention is to provide an improved charging method for a NiMH battery in terms of minimising the required charging time whilst preventing overcharging and thus safeguarding the durability of the battery in terms of retaining its capacity over as many recharging cycles as possible. This object is reached by the method for charging a NiMH battery according to claim 1.

It is a further object of the present invention to provide a battery charger capable of performing the proposed method. Such a battery charger is specified in claim 13.

Moreover, it is yet another object of the present invention to provide a system comprising the proposed battery charger and a hearing device incorporating a NiMH battery. Such a system is defined in claim 20.

Specific embodiments of the present invention are provided in the dependent claims.

The present invention is first directed to a method for charging a NiMH battery, comprising the steps of:
- estimating a state of charge of the battery;
- determining an end of charging time based on the estimated state of charge;
- applying a constant charging current with a rate in the range from 0.9 C to 2.1 C, in particular in the range from 0.95 C to 1.2 C, more particularly of 1 C, to the battery until a threshold voltage is reached; and
- upon reaching the threshold voltage, applying a charging voltage substantially equal to the threshold voltage to the battery until the end of charging time is reached.

In this way it is ensured that any remaining charge present in the battery when charging commences is taken into account and the charging duration adapted accordingly, i.e. is shortened more and more with increasingly higher initial state of charge of the battery.

In a second embodiment the method further comprises the steps of:
- measuring a temperature $T_{bat}$ representative of a temperature of the battery; and
- determining the threshold voltage $V_{th}$ dependent on the measured temperature $T_{bat}$, in particular according to a linear dependency of the threshold voltage on the measured temperature, more particularly according to the function:

$$V_{th}(T_{bat}) = V_N - dV_N/dT_{bat} \cdot T_{bat},$$

wherein $V_N$ is in the range from 1.55 V to 1.6 V, and $dV_N/dT_{bat}$ is in the range from 0.002 V/° C. to 0.003 V/° C., even more particularly according to the specific equation:

$$V_{th}(T_{bat})[V] = 1.57 \text{ V} - 0.0025 \text{ V/° C.} \cdot T_{bat}[° \text{ C.}].$$

In a third embodiment the method further comprises the steps of:

measuring the charging current delivered to the battery; and modifying the end of charging time based on the measured charging current.

In a fourth embodiment of the method the charging current is monitored over a period of time, for instance in the range of 10 to 60 minutes, in particular 30 minutes, and the end of charging time is adjusted, for instance periodically, based on the monitored charging current.

In a fifth embodiment of the method estimating the state of charge of the battery comprises measuring an open circuit voltage of the battery.

In a sixth embodiment of the method:
if the measured open circuit voltage is at least 1.303 V the end of charging time is determined such that the charging duration is in the range from 1 to 3 hours, in particular 2 hours;
if the measured open circuit voltage is less than 1.303 V but at least 1.245 V the end of charging time is determined such that the charging duration is in the range from 3 to 5 hours, in particular 4 hours; and
if the measured open circuit voltage is below 1.245 V the end of charging time is determined such that the charging duration is in the range from 5 to 7 hours, in particular 6 hours.

In an alternative sixth embodiment of the method the end of charging time is determined based on a function of the open circuit voltage which interpolates between at least three value pairs, such as for instance (1.303 V, 2 h), (1.245 V, 4 h), and (1.245 V, 6 h).

In a seventh embodiment of the method the end of charging time is determined such that the charging duration is no more than 6 hours.

In an eighth embodiment the method further comprises the steps of:
repeatedly measuring a further temperature $T_{bat}'$ representative of the temperature of the battery whilst applying the charging voltage; and
adapting the charging voltage in dependence of the measured further temperature $T_{bat}'$, for instance according to the function or equation used in the second embodiment.

In a ninth embodiment the method further comprises the step of providing an indication of the state of charge of the battery, particularly an indication that the state of charge of the battery is sufficient to power a hearing device containing the battery for at least 24 hours.

In a tenth embodiment of the method a positive indication that the state of charge of the battery is sufficient to power a hearing device containing the battery for at least 24 hours is provided when the measured open circuit voltage of the battery is at least 1.16 V, more particularly at least 1.19 V.

In an eleventh embodiment of the method the indication of the state of charge of the battery is provided, for instance optically, such that at least one of the following states is identified:
battery empty;
battery charge is sufficient to power a hearing device containing the battery for at least 24 hours;
battery charge is at least one third of full battery capacity;
battery charge is at least two thirds of full battery capacity;
battery fully charged.

In a twelfth embodiment the method further comprises sending data to a hearing device containing the battery, the data in particular being program code and/or hearing device settings, by discontinuing applying a charging voltage and instead applying a programming voltage adapted to convey data.

The present invention is further directed to a battery charger for charging a NiMH battery, comprising a controllable current source, a connector for connecting the current source with the battery, a state of charge estimator adapted to estimate a state of charge of the battery, a timer, a voltage sensor adapted to measure a charging voltage applied to the battery and a control unit, wherein the control unit is connected with the current source, the state of charge estimator, the timer and the voltage sensor, and wherein the control unit, the current source, the state of charge estimator, the timer and the voltage sensor are jointly adapted to perform the method according to one of the $1^{st}$ and 5th to $7^{th}$ embodiment.

In an embodiment the battery charger further comprises a temperature sensor connected to the control unit and adapted to measure a temperature $T_{bat}$ representative of a temperature of the battery, wherein the control unit, the current source, the state of charge estimator, the timer, the voltage sensor and the temperature sensor are jointly adapted to perform the method according to one of the $2^{nd}$ and $8^{th}$ embodiment.

In a further embodiment the battery charger further comprises a current sensor connected to the control unit and adapted to measure a charging current delivered to the battery, wherein the control unit, the current source, the state of charge estimator, the timer, the voltage sensor, the temperature sensor and the current sensor are jointly adapted to perform the method according to one of the $3^{rd}$ and $4^{th}$ embodiment.

In a further embodiment the battery charger further comprises indicator means connected to the control unit for indicating the state of charge of the battery, the battery charger being adapted to perform the method according to one of the $9^{th}$ to $11^{th}$ embodiment.

In a further embodiment the battery charger further comprises a charger memory unit connected to the control unit, for instance for storing program code and/or hearing device settings, the battery charger being adapted to perform the method according to the $12^{th}$ embodiment. Additionally, the total number of charging cycles performed by the battery charger as well as the duration of each charging cycle, i.e. how long a battery was charged, may also be stored in the charger memory unit.

In a further embodiment the battery charger further comprises a charger battery, such as a lithium polymer or lithium ion battery, connected to the current source and having a capacity which is at least twice that of the NiMH battery. Alternatively, the charger battery may be comprised in the current source.

In a further embodiment the battery charger is formed to fit behind an ear of a person. In this way the battery can be recharged whilst a hearing device powered by the battery is being worn at an ear or at least partially within an ear canal of the person and the hearing device is operating.

The present invention is moreover directed to a system comprising the proposed battery charger and a hearing device to be worn at least partly within an ear canal, in particular completely within the ear canal, more particularly deeply within the ear canal, such as for instance an extended wear hearing device, wherein the hearing device comprises a microphone, an electronics unit, a receiver and a NiMH battery, housed in a shell with a faceplate, and features a vent, wherein the electronics unit comprises a hearing device memory unit, which exclusively consists of volatile memory, and the faceplate provides an opening for the vent, wherein the vent is adapted to act as a charging and/or programming socket, for instance as a socket for the connector for connecting the current source of the battery charger with the NiMH battery of the hearing device.

It is pointed out that combinations of the above-mentioned embodiments give rise to even further, more specific embodiments according to the present invention.

BRIEF DESCRIPTION OF THE DRAWINGS

The present invention is further explained below by means of non-limiting specific embodiments and with reference to the accompanying drawings, which show.

In the figures, like reference signs refer to like parts.

DETAILED DESCRIPTION OF THE INVENTION

Figure 1:
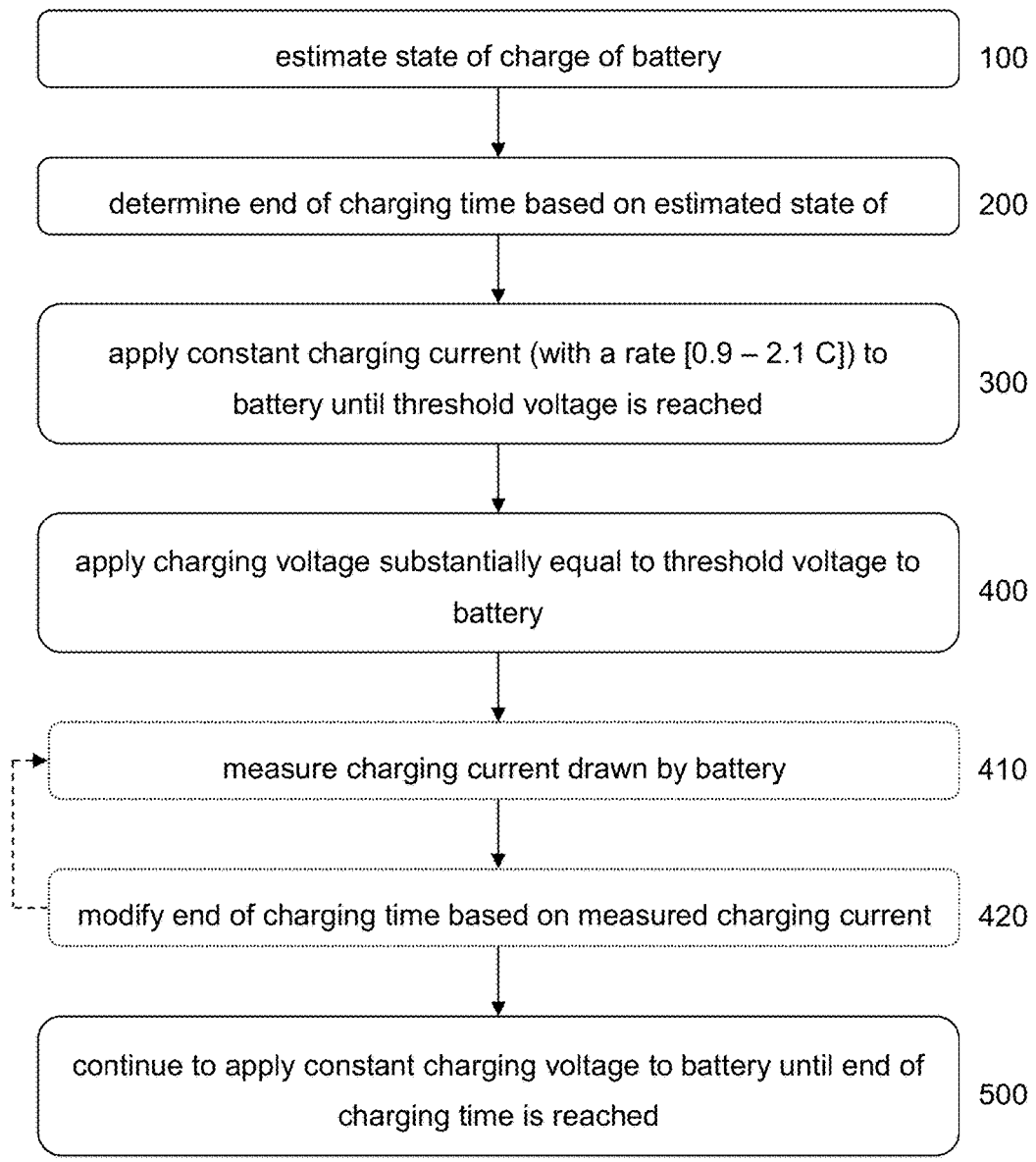
FIG. 1 a flowchart of exemplary methods for charging a NiMH battery according to the present invention.

FIG. 1 depicts a flowchart of exemplary methods for charging a NiMH battery according to the present invention. Initially, the state of charge of the battery is estimated in step 100. Depending on the estimated state of charge the charging duration is determined, i.e. the end of charging time is scheduled in step 200. The charging process then begins by applying a constant charging current with a rate in the range of 0.9 C to 2.1 C to the battery in step 300. For clarification, the quantity of the charging current that is applied to a battery is commonly defined in terms of the rated capacity C (cf. standard IEC-61436 section 1.3.4) of the battery. For example, a battery rated at 12 mAh that is charged at a rate of 1 C will be fully charged to its rated capacity in one hour. This high constant charging current is maintained until a threshold voltage is reached. In an embodiment the threshold voltage is determined dependent on the ambient temperature of the battery according to a linear relationship, e.g. according to the equation:

$$V_{th}(T_{bat})[V]=1.57\ V-0.0025\ V/°\ C.\cdot T_{bat}[°\ C.] \quad \text{(Eq. 1).}$$

Hence, the threshold voltage $V_{th}$ is reduced with increasing temperature $T_{bat}$. The threshold voltage $V_{th}$ is determined at the beginning of the charging process based on a measurement of the temperature in the vicinity of the battery. It is to be noted that during this initial phase of charging, where the battery's state of charge is well below being full, the temperature of the battery is not substantially changed due to charging, i.e. the battery temperature is approximately equal to the ambient temperature of the surroundings in which the battery is located, e.g. room temperature. The exothermic nature of the chemical reactions in NiMH batteries during charging becomes apparent just before and during overcharging at which point considerable heat is generated and the battery temperature starts to steadily increase. The temperature can be monitored continuously, periodically or from time to time. The threshold voltage and subsequently the charging voltage can be adjusted in dependence of the measured temperature. In step 400, upon reaching the threshold voltage, the charging process is altered from applying a constant charging current to applying a constant charging voltage, which is substantially equal to the threshold voltage to the battery. This constant charging voltage is maintained until the end of charging time is reached in step 500, at which point the charging process is terminated in order to avoid overcharging. In an embodiment the charging current delivered to the battery is measured in step 410, e.g. after 30 minutes of charging, and based thereupon the end of charging time may be modified in step 420. This is an effective method for verifying and potentially modifying the end of charging time initially determined based on the state of charge estimated before starting the charging process. This is because the magnitude of the charging current consumed by the battery over the course of the charging process is dependent on the charge level (i.e. the current state of charge) of the battery. Therefore, the charging current measured whilst applying a constant charging voltage provides an up-to-date indication of the battery's state of charge. Especially in situations where the battery is charged for only a brief period of time, e.g. 10 to 15 minutes, following which the charging process is aborted and then restarted again after a short period of time, e.g. an hour or two, the state of charge established before starting the charging process anew, e.g. based on a measurement of the open circuit voltage, will often be considerably over-estimated, thus leading to scheduling of an insufficiently long charging time to fully charge the battery. In this case, the measured charging current will be higher than expected, in view of the over-estimated state of charge value, and therefore the charging time needs to be extended accordingly.

Figure 2:
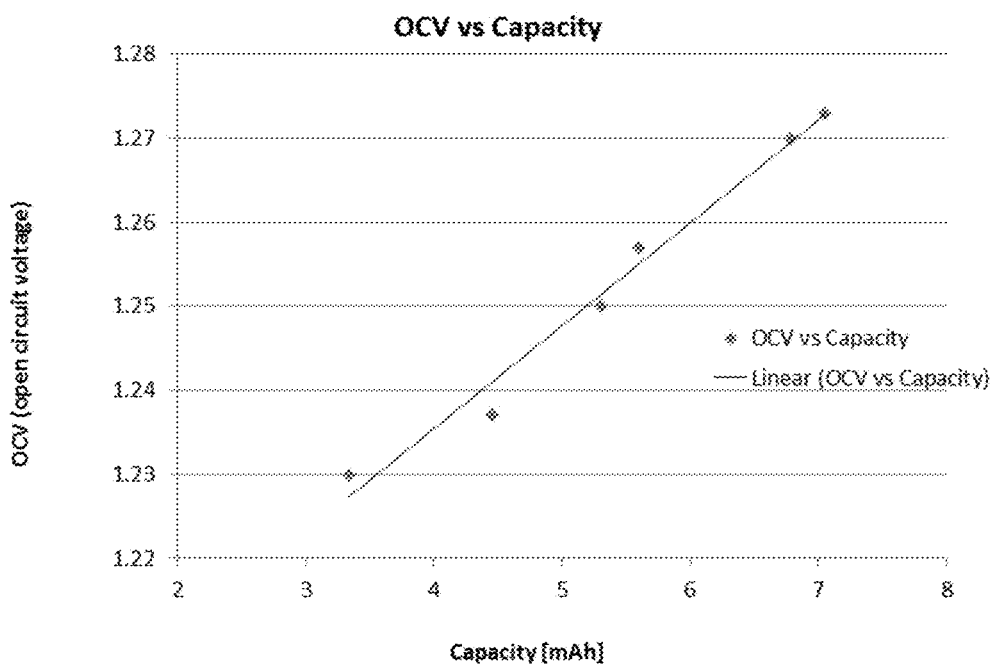
FIG. 2 an exemplary graph showing the initially measured open circuit voltage OVC vs. the remaining capacity of a NiMH battery.

In FIG. 2 an exemplary graph showing the initially measured open circuit voltage (OVC) vs. the remaining capacity of a NiMH battery is displayed. From this graph it can be seen that the measured open circuit voltage of a battery provides a good initial estimate of state of charge of the battery.

Figure 3:
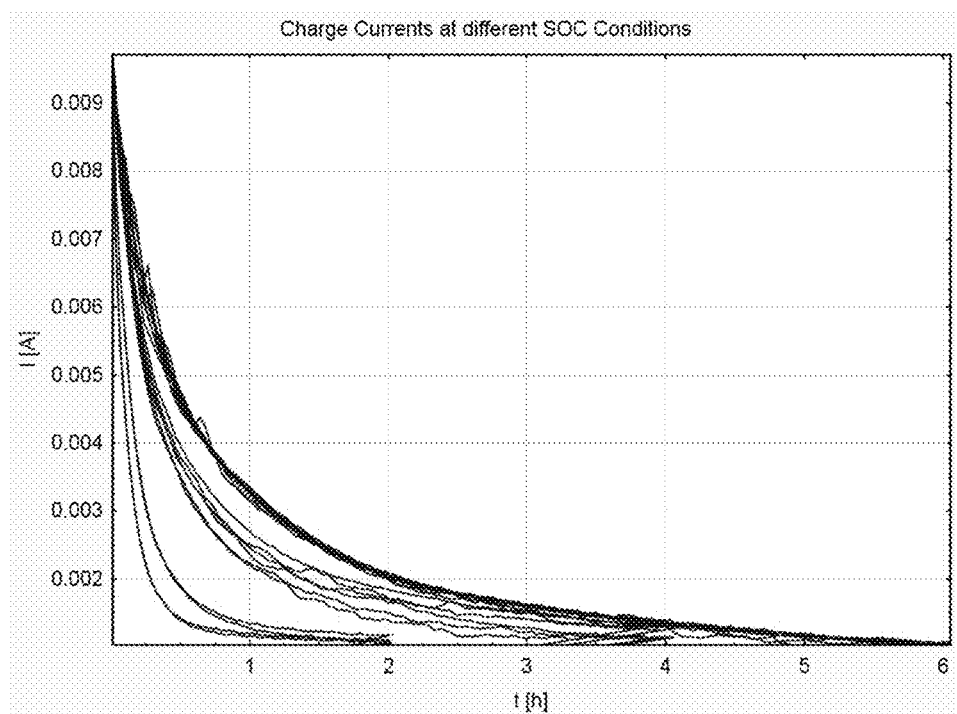
FIG. 3 an exemplary graph showing several traces of the charging current over time for a NiMH battery having different levels of initial state of charge.

FIG. 3, on the other hand, displays an exemplary graph showing several traces of the charging current over time for a NiMH battery having different levels of initial state of charge (SOC). The arrow depicted in the graph is crossing (from the lower left towards the upper right) time traces of a charging current for a battery having a decreasing level of initial SOC. From this graph it can be seen that the higher the actual value of the initial SOC the more rapidly the charging current consumed by a battery during charging decays over time. Hence, regularly measuring, i.e. monitoring over time, the charging current delivered to a battery provides a good further indication of the current state of charge of the battery, which in turn can be utilised to verify and potentially modify the remaining charging duration.

Figure 4:
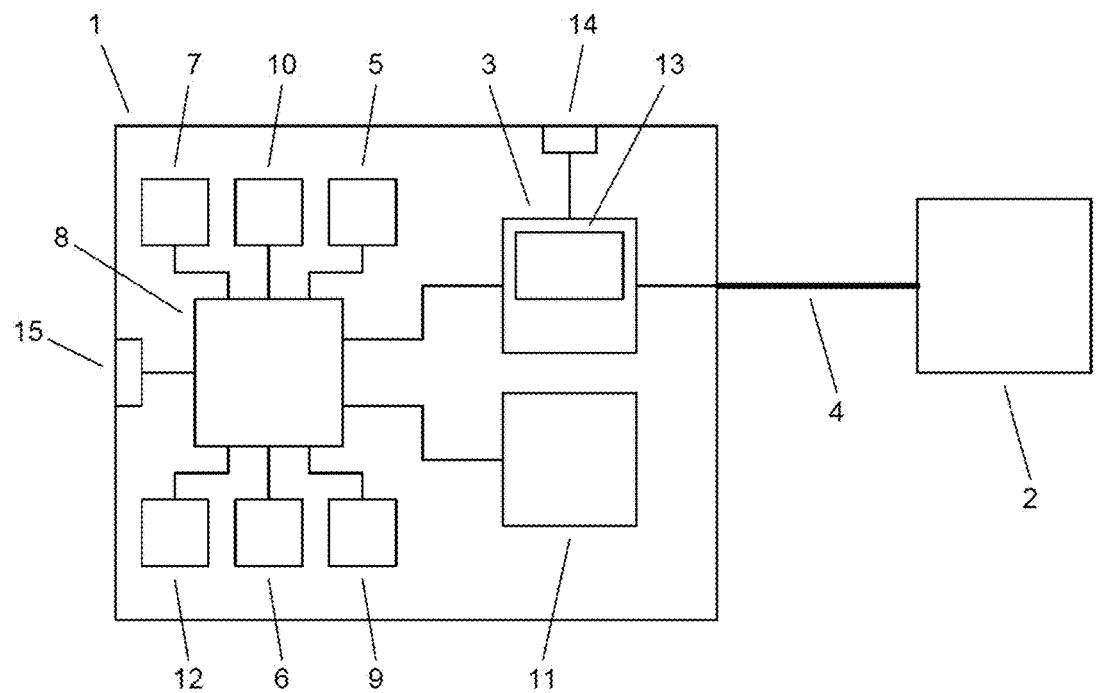
FIG. 4 schematically a high-level block diagram of an exemplary battery charger according to the present invention.

FIG. 4 schematically depicts a high-level block diagram of an exemplary battery charger 1 capable of performing various embodiments of the proposed method for charging a NiMH battery 2 according to the present invention. The battery charger 1 comprises a controllable current source 3, where the charging current and the charging voltage provided at its output can be controlled by a control unit 8. The output of the current source 3 is connected with the battery 2 by means of a connector 4. This can for instance be a cable with a plug adapted to be inserted into a socket located at the hearing device 16 containing the battery 2 (cf. FIG. 5).

Alternatively, the battery charger 1 can feature a hearing device receiving means shaped to receive at least a part of a hearing device and including electrical contacts which allow to connect the output of the current source 3 with the battery 2 in the hearing device. The hearing device receiving means including the electrical contacts would then be regarded as connector 4. Furthermore, a state of charge estimator 5 adapted to estimate a state of charge (SOC) of the battery 2 is connected to the control unit 8. Based on the SOC value obtained from the estimator 5 the control unit 8 determines an end of charging time. The charging duration is for instance set to 2 hours if the measured open circuit voltage (OCV) is at least 1.303 V, to 4 hours if the measured OCV is in the range between 1.303 V and 1.245 V, and to 6 hours, which is the maximum charging time, if the measured OCV is below 1.245 V. Intermediate charging durations may be computed by means of interpolating between these value pairs. Furthermore, a voltage sensor 7 adapted to measure a charging voltage applied to the battery 2 during the initial phase of the charging process, during which the current source 3 applies a constant charging current to the battery 2, is connected to the control unit 8. Once a predetermined threshold voltage is reached the control unit 8 causes the current source 3 to apply a constant charging voltage to the battery 2. As soon as a timer 6 connected to the control unit 8 reaches the end of charging time the control unit 8 terminates the charging process. Additionally, the battery charger 1 can comprise a temperature sensor 9 connected to the control unit 8 and adapted to measure a temperature representative of a temperature of the battery, e.g. of the battery's surroundings. The measured temperature $T_{bat}$ can then be used to determine the threshold voltage $V_{th}$ according to Eq. 1. Moreover, the battery charger 1 can additionally comprise a current sensor 10 connected to the control unit 8 and adapted to measure a charging current delivered to the battery 2. Measurements of the charging current consumed by the battery 2 can be used to further estimate the current SOC of the battery 2 and based thereupon to adjust the end of charging time. Additionally, the battery charger 1 may comprise an indicator means 11, such as one or more LEDs or an LCD display, which provides at indication of the present SOC of the battery 2, such as for instance an indication of the following states:

battery empty;
battery charge is sufficient to power a hearing device containing the battery for at least 24 hours;
battery charge is at least one third of full battery capacity;
battery charge is at least two thirds of full battery capacity;
battery fully charged.

It is especially important for a user of a hearing device 16 to be provided with an indication that the battery charge is sufficient to power the hearing device 16 for at least a day (i.e. 24 hours). A hearing device 16 featuring a 10A NiMH battery 2 with a capacity of 12 mAh and exhibiting a current consumption of 40 µA requires a charge of 1 mAh, i.e. $\frac{1}{12}$ the total capacity, per day. This charge can be provided by the battery charger 1 in approximately 10 to 15 minutes. The corresponding "charge sufficient for 24 h" indicator of the indicator means 11 can be activated if the voltage initially measured by the voltage sensor 7 has a value of at least 1.19 V or after a predetermined charging time, e.g. 10 minutes.

Furthermore, the battery charger 1 additionally comprises a charger memory unit 12 connected to the control unit 8, for instance for storing program code and/or hearing device settings. The program code and/or hearing device settings can then be sent from the charger memory unit 12 to a hearing device 16 containing the battery 2 in that the control unit 8 causes the current source 3 to apply a programming voltage adapted to convey data, i.e. by means of an appropriate signal coding scheme. Prior to sending the data a special voltage waveform is output by the current source 3 in order to signal to the hearing device 16 that charging is to be discontinued and data is about to be transmitted. The hearing device thereupon switches from charging mode to data reception mode. Data can be loaded into the charger memory unit 12 via the data/programming interface 15, which can be either a wired interface or a wireless interface comprising an appropriate transceiver such as for instance a Bluetooth transceiver.

Additionally, data regarding individual charging cycles, e.g. their duration, as well as for instance the total number of charging cycles performed by the battery charger can be logged and stored in the charger memory unit 12. Moreover, data measured by the voltage sensor 7, the temperature sensor 9 and the current sensor 10 may also be logged and stored in the charger memory unit 12. This logged data may then be readout from the charger memory unit 12 via the data/programming interface 15 by a hearing device fitter in order to analyse the charging cycles that have been performed as well as the users charging habits. Based on information derived therefrom the fitter can for instance advise the hearing device user on how to improve his charging habits or can gauge when the battery will reach its end of life.

Furthermore, the battery charger 1 additionally comprises a charger battery 13, such as a lithium polymer or lithium ion battery, connected to the current source 3 or comprised therein. The charger battery 13 is further connected to a charging interface 14 through which the charger battery 13 can be charged from an external power source. The charger battery 13 has a capacity which is multiple times, for instance two to six times, that of the NiMH battery 2, so that it can hold sufficient charge for recharging the NiMH battery 2 several times over. Moreover, the charger battery 13 can also provide the power necessary to operate the battery charger 1.

The battery charger 1 comprising a charger battery 13 can operate as a portable, self-sufficient device which a user of a hearing device can carry along with him at all times. The battery charger 1 can be formed so as to fit behind the ear of the user, such that charging can even be performed during normal operation of the hearing device 16 by connecting the battery charger 1 being worn at the ear with the hearing device 16 containing the battery 2 via the connector 4 whilst the hearing device 16 is being worn at least partly within the ear canal.

Figure 5:
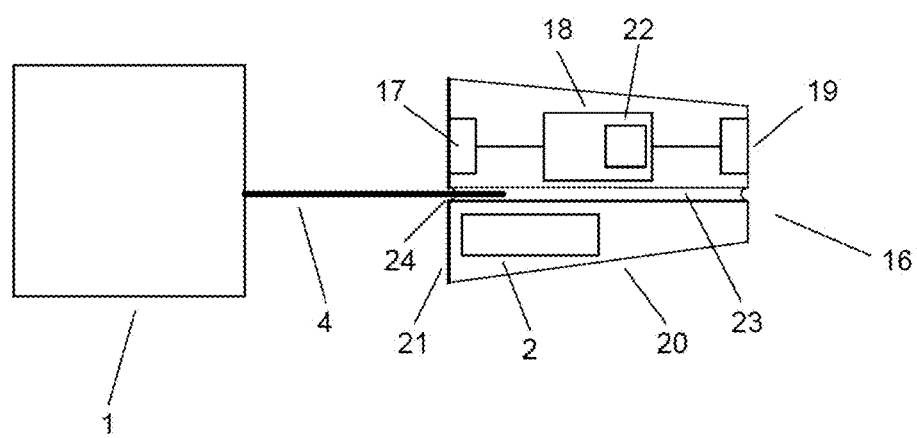
FIG. 5 schematically a block diagram of an exemplary system according to the present invention comprising a battery charger and a hearing device with a battery.

FIG. 5 schematically depicts a high-level block diagram of an exemplary system comprising a battery charger 1 and a hearing device 16 with a NiMH battery 2 according to a further aspect of the present invention. Especially, hearing devices 16 intended to be worn deeply within the ear canal profit from using a rechargeable battery 2 instead of a traditional single-use zinc air battery. Examples of such hearing devices 16 are for instance the Philips XP Peritympanic deep canal CIC aid, the Starkey Tympanette and SoundLens, the Songbird Flexfit disposable hearing aid, and Insound's Lyric extended wear hearing aid. U.S. Pat. No. 6,205,227 B1 also relates to a peritympanic hearing instrument, WO 00/32009 A2 relates to a semi-permanent canal hearing device, and WO 00/76271 A1 relates to an extended wear canal hearing device. The use of rechargeable batteries 2 is advantageous on the one hand because such deep-fitted hearing devices 16 need to be particularly small and on the other hand because they are typically worn constantly over a prolonged period of time, e.g. many days up to weeks, without being removed since their insertion and extraction is a tricky and quite awkward procedure oftentimes requiring the help of a specialist. Consequently, the battery 2 needs to be sealed into the hearing device 16 (usually together with the electronics unit 18) in order to prevent sweat from disrupting battery operation, and moreover in order to minimise size by doing without a battery door. The hearing device 16 of the present system comprises a microphone 17, an electronics unit 18 and a receiver 19, and is powered by a NiMH battery 2, all of which are housed in a shell 20 with a faceplate 21. The hearing device 16 especially features a vent 23 with an opening 24 located at the faceplate 21, the vent 23 being adapted to act as a charging and/or programming socket, for instance as a socket for the connector 4 for connecting the current source 3 of the battery charger 1 with the NiMH battery 2 of the hearing device 16. Furthermore, the electronics unit 18 comprises a hearing device memory unit 22, which exclusively consists of volatile memory. The reason for using only volatile memory instead of additionally employing non-volatile memory (NVM) such as EEPROM is because the latter requires a more complex and costly integrated circuit technology and must be powered with higher voltages. NVM is utilised to permanently store the hearing device settings and programme code also during periods where the hearing device 16 is without power, for instance whilst a conventional battery is being exchanged. A rechargeable hearing device 16 will turn off its functionality before the battery 2 is totally empty and still have enough power to retain the data in the volatile memory. In case the battery 2 is completely exhausted and the data is lost because of this, the data (i.e. hearing device programme code as well as hearing device settings) can be provided again by transferring a copy of the data from the charger memory unit 12 of the battery charger 1 back into the hearing device memory unit 22 of the hearing device 16 using the method according to the 12$^{th}$ embodiment of the present invention, i.e. by configuring the battery charger 1 to apply a programming voltage adapted to convey data via the connector 4. This also helps to save space over having to provide separate facilities for charging and programming, i.e. by employing a single socket, which is for instance formed by part of the vent 23 having the opening 24 located at the faceplate 21.

Hearing device settings and optionally hearing device programme code can be copied from the charger memory unit 12 into the hearing device memory unit 22 each time the hearing device 16 is connected to the battery charger 1 in order to ensure that the data stored in the hearing device memory unit 22 is always correct upon disconnecting the two devices. In this way data possibly corrupted during operation of the hearing device 16, e.g. due to insufficient power supply, is restored to its correct value, or outdated data is replaced by up-to-date data. This requires that whenever settings or programme code of the hearing device is changed, e.g. during fitting or fine-tuning of the hearing device 16 by a fitter, the new data must also be stored in the charger memory unit 12 of the battery charger 1. In case the hearing device user forgets to bring along the battery charger 1 to the fitter, the fitter can provide this data to the user "off-line", e.g. via a portable storage medium, such as a USB memory stick, or for downloading from a database via the Internet. Once the battery charger 1 is connected to a computer via the data/programming interface 15 the new data can be transferred to the charger memory unit 12. In much the same way firmware updates for the battery charger 1, e.g. including a revised charging algorithm or improved charging parameters, may be downloaded and transferred to the charger memory unit 12. Likewise, logged data stored in the charger memory unit 12 as well as hearing device settings or operational data logged by the hearing device 16 and copied to the charger memory unit 12 can be transferred to a computer and then uploaded to a fitter's location for analysis, allowing the fitter to remotely troubleshoot problems the user is having with the battery charger 1 and/or the hearing device 16.

The invention claimed is:

1. A method for charging a NiMH battery of a hearing device, the method comprising:
   estimating a state of charge of the NiMH battery,
      wherein the NiMH is physically coupled to a hearing device;
   determining an end of charging time based on the estimated state of charge;
   measuring a temperature $T_{bat}$ representative of a temperature of the NiMH battery;
   determining a threshold voltage $V_{th}$ dependent on the measured temperature $T_{bat}$;
   applying a charging current with a rate from 0.9 C to 2.1 C to the NiMH battery;
   repeatedly measuring a further temperature $T_{bat'}$ representative of the temperature of the NiMH battery while applying a charging voltage;
   adapting the charging voltage based on the measured further temperature $T_{bat'}$; and
   upon reaching the threshold voltage, applying a voltage substantially equal to the threshold voltage to the NiMH battery until the end of charging time is reached.

2. The method of claim 1, the method further comprising:
   measuring the charging current delivered to the NiMH battery; and
   modifying the end of charging time based on the measured charging current.

3. The method of claim 2, wherein the charging current is monitored over a period of time from 10 to 60 minutes.

4. The method of claim 1, wherein estimating the state of charge of the NiMH battery comprises measuring an open circuit voltage of the NiMH battery.

5. The method of claim 4, wherein:
   if the measured open circuit voltage is at least 1.303 V the end of charging time is determined such that the charging duration is in the range from 1 to 3 hours, in particular 2 hours;
   if the measured open circuit voltage is at least 1.245 V and less than 1.303 V the end of charging time is determined such that the charging duration is in the range from 3 to 5 hours, in particular 4 hours; and
   if the measured open circuit voltage is less than 1.245 V the end of charging time is determined such that the charging duration is in the range from 5 to 7 hours, in particular 6 hours;
   or alternatively, the end of charging time is determined based on a function of the open circuit voltage which interpolates between at least three value pairs, such as for instance (1.303 V, 2 h), (1.245 V, 4 h), and (1.245 V, 6 h).

6. The method of claim 1, wherein the end of charging time is determined such that the charging duration is no more than 6 hours.

7. The method of claim 1, further comprising: providing an indication of the state of charge of the NiMH battery, particularly an indication that the state of charge of the NiMH battery is sufficient to power the hearing device containing the NiMH battery for at least 24 hours.

8. The method of claim 7, wherein a positive indication that the state of charge of the NiMH battery is sufficient to power the hearing device containing the NiMH battery for at least 24 hours is provided when the measured open circuit voltage of the NiMH battery is at least 1.16 V, more particularly at least 1.19 V.

9. The method of claim 7, wherein the indication of the state of charge of the NiMH battery is provided such that at least one of the following states is identified:
- battery empty;
- battery charge is sufficient to power the hearing device containing the battery for at least 24 hours;
- battery charge is at least one third of full battery capacity;
- battery charge is at least two thirds of full battery capacity; or
- battery fully charged.

10. The method of claim 1, further comprising sending data to the hearing device, the data in including a program code and/or hearing device settings, and
- discontinuing to apply the charging voltage and instead applying a programming voltage for conveying programming data.

11. The method of claim 1, wherein the determined threshold voltage Vth is dependent on the measured temperature according to a linear dependency according to the function:

$$V_{th}(T_{bat}) = V_N - dV_N/dT_{bat} \cdot T_{bat},$$

wherein VN is in the range from 1.55 V to 1.6 V, and dVN/dTbat is in the range from 0.002 V/° C. to 0.003 V/° C.

12. A battery charger for charging a NiMH battery in a hearing device, the battery charger comprising:
- a controllable current source;
- a connector for connecting the current source with the NiMH battery;
- a state of charge estimator for estimating a state of charge of the NiMH battery, a timer;
- a temperature sensor configured to measure a temperature $T_{bat}$ of the NiMH battery;
- a voltage sensor for measuring a charging voltage applied to the NiMH battery; and
- a control unit, wherein the control unit is physically or electronically coupled to the current source, the state of charge estimator, the timer, the temperature sensor, and the voltage sensor, and wherein the control unit, the current source, the state of charge estimator, the timer, the temperature sensor, and the voltage sensor are configured to determine a threshold voltage $V_{th}$, a time estimate for charging the NiMH battery, and a charging voltage for the NiMH at least partially based the temperature $T_{bat}$ of the NiMH battery,
- wherein the battery charged is configured to charge a hearing device.

13. The battery charger of claim 12, further comprising a current sensor connected to the control unit and for measuring the charging current delivered to the NiMH battery.

14. The battery charger of claim 12, further comprising indicator means connected to the control unit for indicating the state of charge of the NiMH battery, the battery charger indicating that the state of charge of the NiMH battery is sufficient to power the hearing device containing the NiMH battery for at least 24 hours.

15. The battery charger of claim 12, further comprising a charger memory unit connected to the control unit configured to store program code and/or hearing device settings, the battery charger performing a method of sending data to the hearing device containing the NiMH battery (2) by discontinuing applying a charging voltage and instead applying a programming voltage for conveying programming data.

16. The battery charger of claim 12, wherein the current source comprises a charger battery, such as a lithium polymer battery, having a capacity which is at least twice that of the NiMH battery.

17. The battery charger of claim 12, wherein the battery charger is formed to fit behind an ear of a person.

* * * * *